United States Patent
Prasadh et al.

(10) Patent No.: US 11,181,957 B1
(45) Date of Patent: Nov. 23, 2021

(54) RESET PROTECTION SCHEME FOR FUNCTIONAL SAFETY APPLICATIONS

(71) Applicant: Arm Limited, Cambridge (GB)

(72) Inventors: Ramamoorthy Guru Prasadh, Austin, TX (US); Tushar P Ringe, Austin, TX (US); Kishore Kumar Jagadeesha, Austin, TX (US); David Joseph Hawkins, Austin, TX (US); Saira Samar Malik, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/102,963

(22) Filed: Nov. 24, 2020

(51) Int. Cl.
*G06F 1/24* (2006.01)
*H03K 19/20* (2006.01)
*G06F 1/12* (2006.01)
*G06F 1/08* (2006.01)
*H03K 3/037* (2006.01)
*H03K 5/00* (2006.01)

(52) U.S. Cl.
CPC .................. *G06F 1/24* (2013.01); *G06F 1/08* (2013.01); *G06F 1/12* (2013.01); *H03K 3/037* (2013.01); *H03K 19/20* (2013.01); *H03K 2005/00078* (2013.01)

(58) Field of Classification Search
CPC ..... G06F 1/08; G06F 1/12; G06F 1/24; G06F 11/1629; H03K 3/037; H03K 17/20; H03K 19/1774; H03K 19/20; H03K 19/21; H03K 19/23; H03K 21/40; H03K 2005/00078
See application file for complete search history.

(56) References Cited

U.S. PATENT DOCUMENTS

2018/0287616 A1* 10/2018 Townley .................... G06F 1/12
2021/0135659 A1* 5/2021 Lee ......................... H03K 3/037

* cited by examiner

*Primary Examiner* — Long Nguyen
(74) *Attorney, Agent, or Firm* — Leveque Intellectual Property Law, PC (57) ABSTRACT

An improved apparatus and method for the protection of reset in systems with stringent safety goals that employ primary and shadow logic blocks with a lock-step checker to achieve functional safety, including those systems having very large fanout of primary and shadow reset signal trees. The disclosed apparatus and method support assertion of reset that is asynchronous to the system clock and deassertion of reset that is synchronous to the system clock. Shadow logic blocks have reset deasserted a fixed number of clock cycles after their respective primary logic blocks, thereby avoiding the requirement to synchronize the primary and shadow reset signal trees at each of their end points to ensure lock-step operation between the primary and shadow logic blocks.

15 Claims, 8 Drawing Sheets

RESET PROTECTION SCHEME FOR FUNCTIONAL SAFETY APPLICATIONS

BACKGROUND

Systems having stringent safety goals frequently require functional safety, i.e., proper operation of functions (e.g., automatic protection functions) in response to inputs. Such systems may be found, for example, in the aerospace and motor vehicle industries, and frequently employ a lock-step technique in which functional units are comprised of duplicate logic blocks, with primary and shadow logic blocks operating in delayed lock-step relative to each other. As the name indicates, the shadow logic block shadows, or duplicates, the operations of the primary logic block, with a fixed clock cycle delay.

The functional units also are coupled to primary and shadow reset signal trees. When coming out of reset, it is important that the fixed clock cycle delay be maintained, i.e., that all shadow logic blocks have reset deasserted by the shadow reset signal tree at the same desired delay relative to their respective primary logic blocks and the primary reset signal tree. This can be difficult to ensure, especially in modern systems in which the fanout of the primary and shadow reset signal trees is often very large.

An improved method and apparatus to assert and deassert global signals, e.g., reset, while meeting functional safety requirements is therefore desired.

BRIEF DESCRIPTION OF THE DRAWINGS

The accompanying drawings provide visual representations, which will be used to more fully describe various representative embodiments and can be used by those skilled in the art to better understand the representative embodiments disclosed and their inherent advantages. In these drawings, like reference numerals identify corresponding elements.

DETAILED DESCRIPTION

While this disclosure is susceptible of embodiment in many different forms, there is shown in the drawings and will herein be described in detail specific embodiments, with the understanding that the present disclosure is to be considered as an example of the principles described and not intended to limit the disclosure to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprise", "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, or acts are in some way inherently mutually exclusive.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

A "module" as used herein describes a component or part of a program or device that can contain hardware or software, or a combination of hardware and software. In a module that includes software, the software may contain one or more routines, or subroutines. One or more modules can make up a program and/or device.

Systems having stringent safety goals frequently employ a lock-step technique in which functional units are comprised of duplicate logic blocks, with primary and shadow logic blocks operating in delayed lock-step relative to each other. As the name indicates, the shadow logic block shadows, or duplicates, the operations of the primary logic block, with a fixed clock cycle delay. A logic block is a circuit structure that performs logical (e.g., Boolean) operations on an input to generate an output, and may be, for example and without limitation, a structure of standard-cell logic gates, a structure of custom-designed logic gates, a programmable logic array (PLA), a field-programmable gate array (FPGA), or a combination of these or other types. A logic block may perform combinational (combinatorial) logic, sequential logic, or a combination of both, and may be described by a hardware description language such as Verilog or VHDL.

In each functional unit, a lock-step checker monitors the outputs of the primary and shadow logic blocks every clock cycle. Random hardware faults in the logic would cause outputs of the primary and shadow logic blocks to diverge which can then be detected by the lock-step checker.

Such systems also employ fully duplicated (primary and shadow) reset signal trees, carrying independent reset signals. The primary reset signal tree feeds the primary logic block as well as the lock-step checker in each functional unit. Similarly, the shadow reset signal tree feeds the shadow logic block and lock-step checker in each functional unit. Since the primary reset signal tree is fully duplicated, this scheme achieves very high diagnostic coverage (DC) for any faults on the primary reset signal tree, e.g., either stuck-at faults (i.e., faults in which a signal is "stuck at 0" or "stuck at 1") or transient faults, thereby eliminating common-mode faults.

Figure 1:
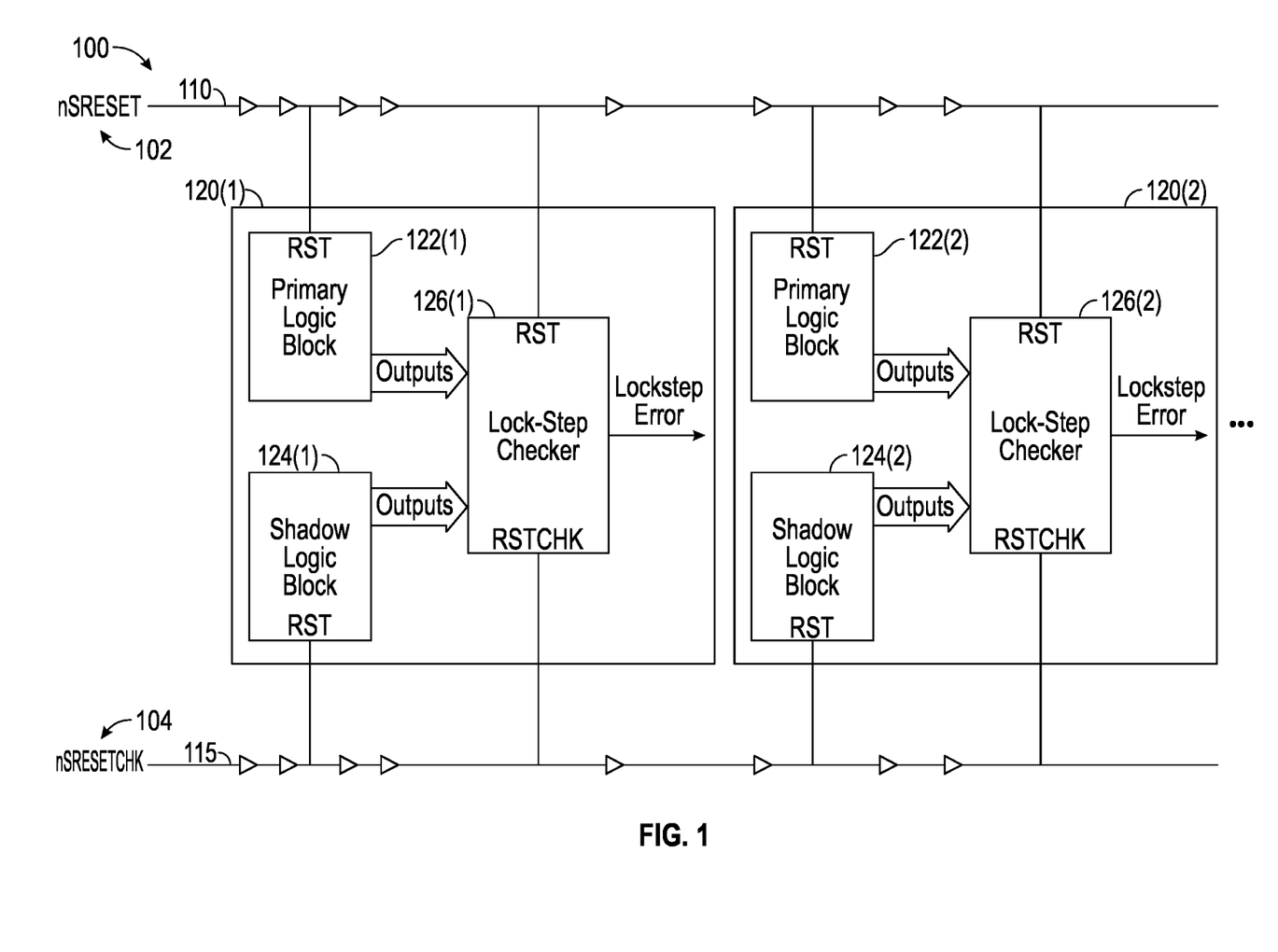
FIG. 1 illustrates a system to assert and deassert reset.

FIG. 1 shows such a system 100 in which primary reset signal tree 110 and shadow reset signal tree 115 are coupled to functional units 120(1), 120(2), . . . , 120(m), where m is any suitable number. Primary reset signal tree 110 carries primary reset signal 102 (nRESET) and shadow reset signal tree 115 carries shadow reset signal 104 (nRESETCHK). Each functional unit 120 comprises primary logic block 122, shadow logic block 124 and lock-step checker 126. The outputs of primary logic block 122 and shadow logic block 124 are coupled to lock-step checker 126, which detects any mismatch between the outputs. In functional unit 120, primary reset signal tree 110 is coupled to primary logic block 122 and lock-step checker 126, and shadow reset signal tree 115 is coupled to shadow logic block 124 and lock-step checker 126.

An issue with the reset scheme of system 100 is that the two independent reset signal trees, primary reset signal tree 110 and shadow reset signal tree 115, need to be synchronized at each of their end points to ensure lock-step operation between primary and shadow logic blocks. Specifically, the deassertion of reset needs to be synchronized such that each shadow logic block comes out of reset precisely n clock cycles after the corresponding primary logic block, where n is the lock-step delay in clock cycles and may represent any suitable value, e.g., 2 clock cycles. Attaining this synchronization can present a big challenge in a large system such as an interconnect where the reset signal trees can have a large fanout, and when variations in semiconductor process, temperature, and supply voltage are considered.

Figure 2:
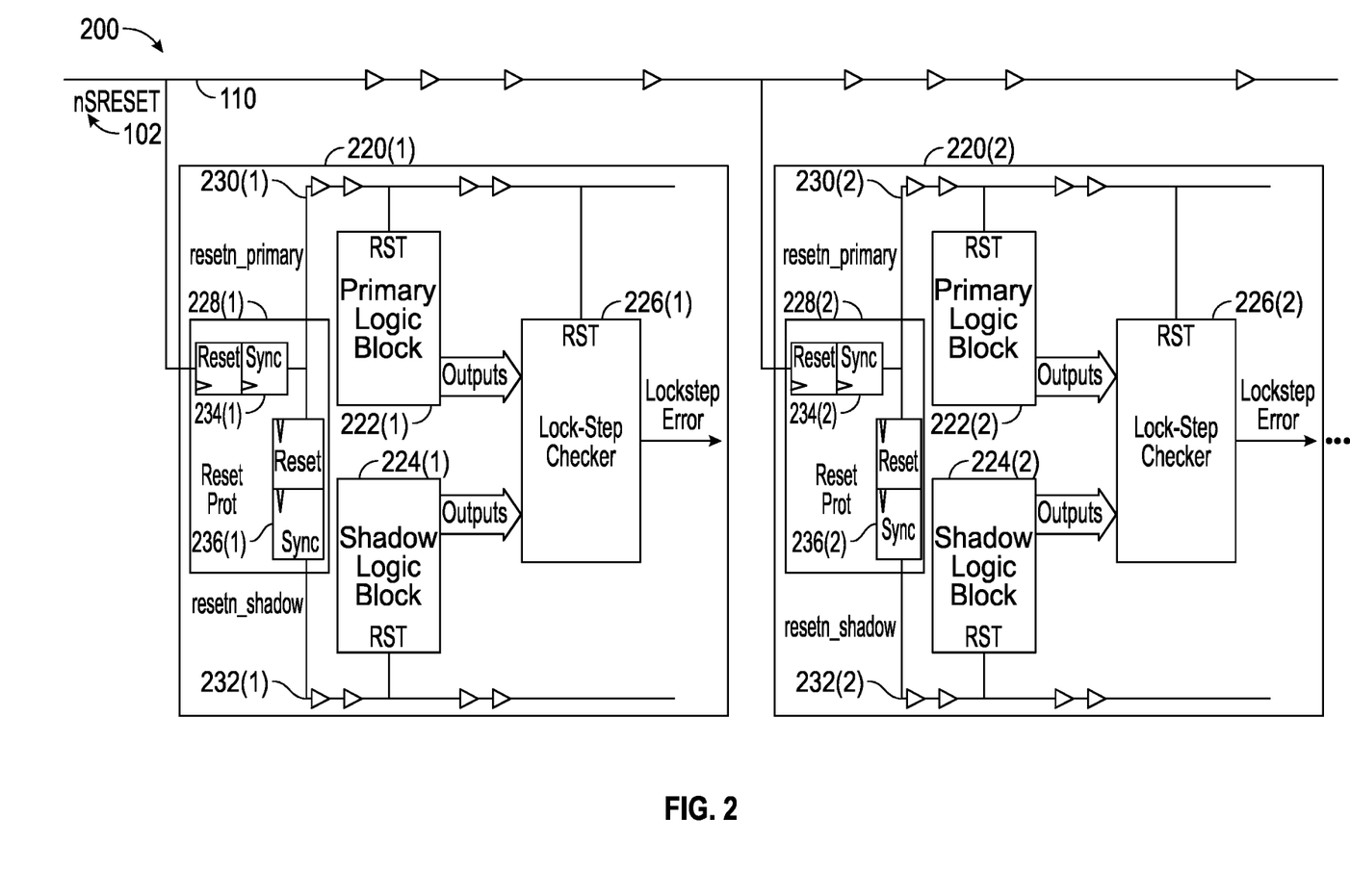
FIG. 2 illustrates a system to assert and deassert reset, in accordance with an embodiment.

FIG. 2 shows a system 200 according to an embodiment. In system 200, primary reset signal tree 110 is coupled to functional units 220(1), 220(2), . . . , 220(m), where m is any suitable number. Each functional unit 220 comprises primary logic block 222, shadow logic block 224, lock-step checker 226 and reset protector block 228. The outputs of primary logic block 222 and shadow logic block 224 are coupled to lock-step checker 226, which detects any mismatch between the outputs. Reset protector block 228 is comprised of flip-flop 234 and flip-flop(s) 236.

Primary reset signal 102 (nSRESET) present on primary reset signal tree 110 is asserted (active) when low. In each functional unit 220, primary reset signal 102 (nSRESET) is coupled to reset protector block 228. In reset protector block 228, reset deassertion is synchronized by flip-flop 234, generating resetnprimary signal 230 (primary local reset). Resetnprimary signal 230 is coupled to flip-flop(s) 236, generating resetn_shadow signal 232 (shadow local reset). Resetnprimary signal 230 and resetn_shadow signal 232 are then coupled to primary logic block 222 and shadow logic block 224, respectively. Resetn_primary signal 230 is also coupled to lock-step checker 226. As is understood from this description and as illustrated in FIG. 2, resetn_primary signal 230 (primary local reset) and resetn_shadow signal 232 (shadow local reset) are local to the functional unit 220 in which each is generated; e.g., resetn_primary signal 230(1) (primary local reset) and resetn_shadow signal 232 (1) (shadow local reset) are local to functional unit 220(1).

While the assertion of reset by both resetnprimary signal 230 and resetn_shadow signal 232 is asynchronous, the deassertion of reset is synchronous to the clock by action of flip-flop 234. Additionally, deassertion of resetn_shadow signal 232 is delayed with respect to the resetnprimary signal 230 by the lock step delay of n cycles of the clock due to the action of flip-flop(s) 236 in reset protector block 228. (In this embodiment, n=2, but n may be any rational number; other values of n are contemplated and may be achieved by various circuit arrangements.) This arrangement ensures that shadow logic block 224 comes out of reset precisely n cycles of the clock after primary logic block 222, thereby maintaining lock step and resolving a major issue with the reset scheme of system 100 in FIG. 1.

Resetnprimary signal 230 is coupled to primary logic block 222 and lock-step checker 226 while resetn_shadow signal 232 is coupled to shadow logic block 224. This arrangement allows for isolation of resetnprimary signal 230 and resetn_shadow signal 232 within each functional block 220. This isolation further allows failures resulting from stuck-at faults or transient faults on either signal to be detected by lock-step checker 226.

However, a transient fault on primary reset signal tree 110 results in a common mode failure since it affects both resetnprimary signal 230 and resetn_shadow signal 232 in the same way. Hence the lock-step checker is not able to detect failures caused by transient faults on primary reset signal tree 110.

Figure 3:
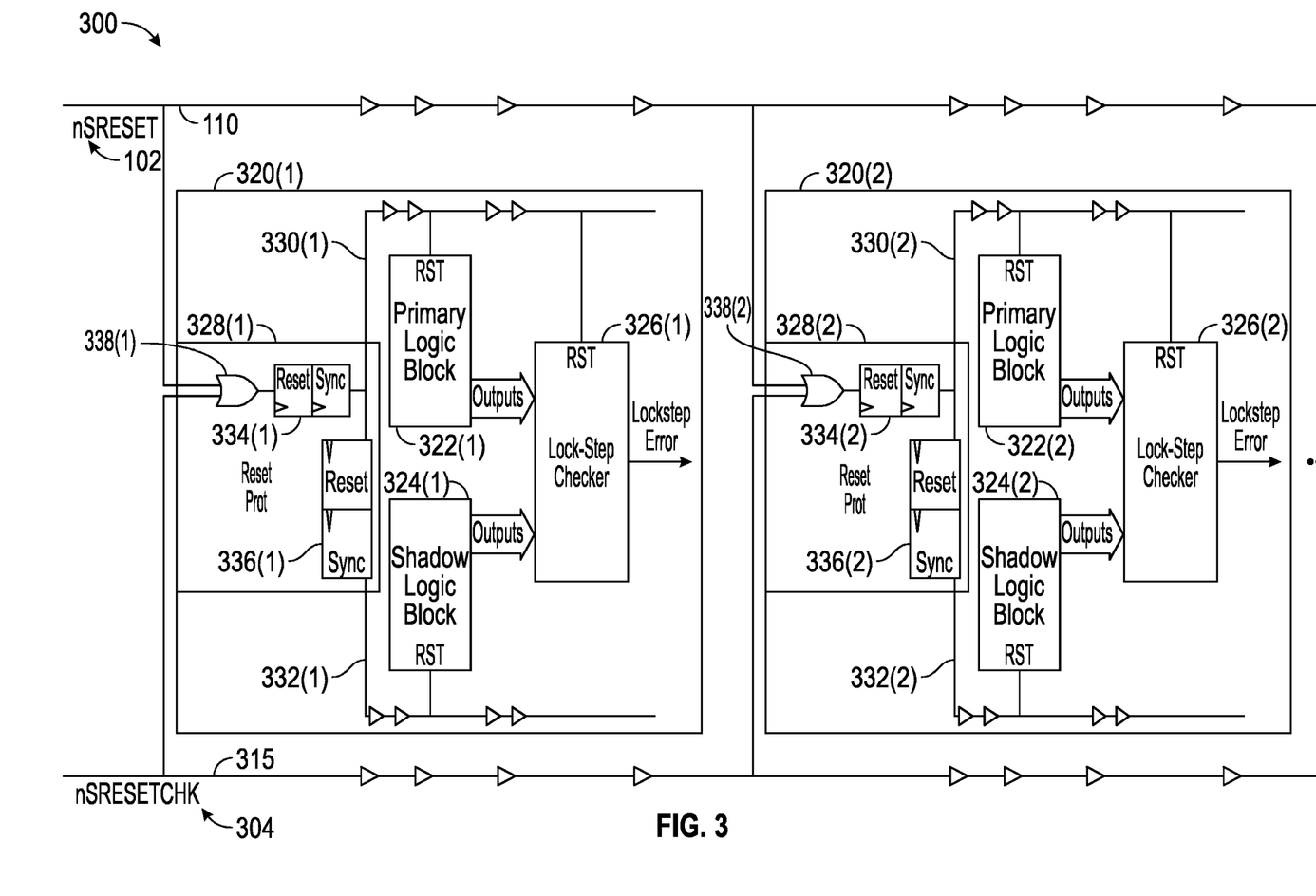
FIG. 3 illustrates a system to assert and deassert reset, in accordance with an embodiment.

FIG. 3 shows a system 300 for addressing such transient faults, according to an embodiment. In this embodiment, primary reset signal tree 110 is coupled to functional units 320(1), 320(2), . . . , 320(m), where m is any suitable number. Primary reset signal 102 (nSRESET) is present on primary reset signal tree 110. Shadow reset signal tree 315 is also coupled to each functional unit 320, which comprises primary logic block 322, shadow logic block 324, lock-step checker 326 and reset protector block 328. Shadow reset signal 304 (nSRESETCHK) is present on shadow reset signal tree 315. The outputs of primary logic block 322 and shadow logic block 324 are coupled to lock-step checker 326, which detects any mismatch between the outputs.

Reset protector block 328 is comprised of flip-flop 334, flip-flop(s) 336 and logical OR gate 338. In functional unit 320, primary reset signal tree 110 and shadow reset signal tree 315 are coupled to logical OR gate 338 in reset protector block 328. Since primary reset signal 102 (nSRESET) present on primary reset signal tree 110 and shadow reset signal 304 (nSRESETCHK) present on shadow reset signal tree 315 are both asserted when low, the OR function serves to suppress transient errors on either OR gate 338 input, primary reset signal 102 or shadow reset signal 304, caused by transient faults.

In reset protector block 328, reset deassertion is synchronized by flip-flop 334, generating resetnprimary signal 330. Resetnprimary signal 330 is coupled to flip-flop(s) 336, generating resetn_shadow signal 332. Resetnprimary signal 330 and resetn_shadow signal 332 are then coupled to primary logic block 322 and shadow logic block 324, respectively. Resetnprimary signal 330 is also coupled to lock-step checker 326. Deassertion of resetn_shadow signal 332 is delayed with respect to the resetnprimary signal 330 by the lock step delay of n cycles of the clock due to the action of flip-flop(s) 336 in reset protector block 328. (In this embodiment, n=2, but n may be any rational number; other values of n are contemplated and may be achieved by various circuit arrangements.) This arrangement ensures that shadow logic block 324 comes out of reset precisely n cycles of the clock after primary logic block 322, thereby maintaining lock step.

Reset of functional units 320 is asserted only when both reset inputs are asserted (both primary reset signal 102 and shadow reset signal 304 must be low in this configuration). This ensures that a transient on either reset input alone will not reset functional units 320.

Figure 4:
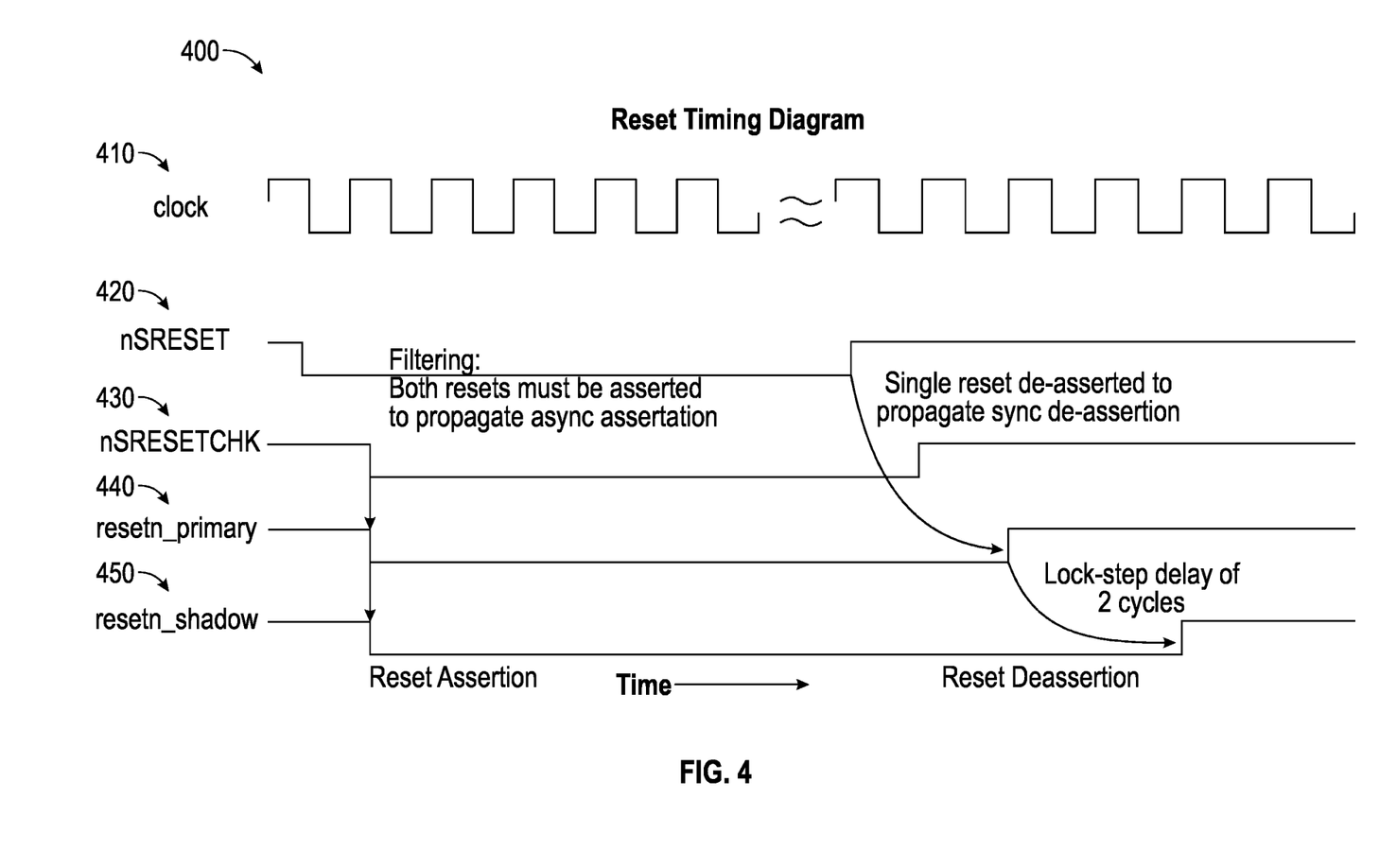
FIG. 4 illustrates a reset timing diagram, in accordance with an embodiment.

Behavior of system 300 is illustrated in waveforms 400 of FIG. 4, in which resetnprimary signal waveform 440 and resetn_shadow signal waveform 450 do not go low (assert) until both primary reset signal waveform 420 (nSRESET) and shadow reset signal waveform 430 (nSRESETCHK) are low, but resetnprimary signal waveform 440 and resetn_shadow signal waveform 450 can assert asynchronously (i.e., independent of an edge of clock signal waveform 410). However, resetnprimary signal waveform 440 and resetn_shadow signal waveform 450 can go high (deassert) in response to either primary reset signal waveform 420 (nSRESET) or shadow reset signal waveform 430 (nSRESETCHK) going high, and there is a two-clock-cycle delay between the deassertion of resetnprimary signal waveform 440 and resetn_shadow signal waveform 450. Note that the delay shown between the deassertion of primary reset signal waveform 420 (nSRESET) and shadow reset signal waveform 430 (nSRESETCHK) is arbitrary, as may occur due to differing propagation delays between primary reset signal tree 110 and shadow reset signal tree 315.

A stuck-at fault on either reset input (primary reset signal 102, or shadow reset signal 304) could prevent functional unit 320 from getting reset. In order to detect stuck-at faults, the reset protection block implements reset checkers that compare the functional block resets (resetn_primary signal 330 and resetn_shadow signal 332) with the reference input reset signals (primary reset signal 102 and shadow reset signal 304, from primary reset signal tree 110 and shadow reset signal tree 315, respectively) and flag errors when they mismatch.

Figure 5:
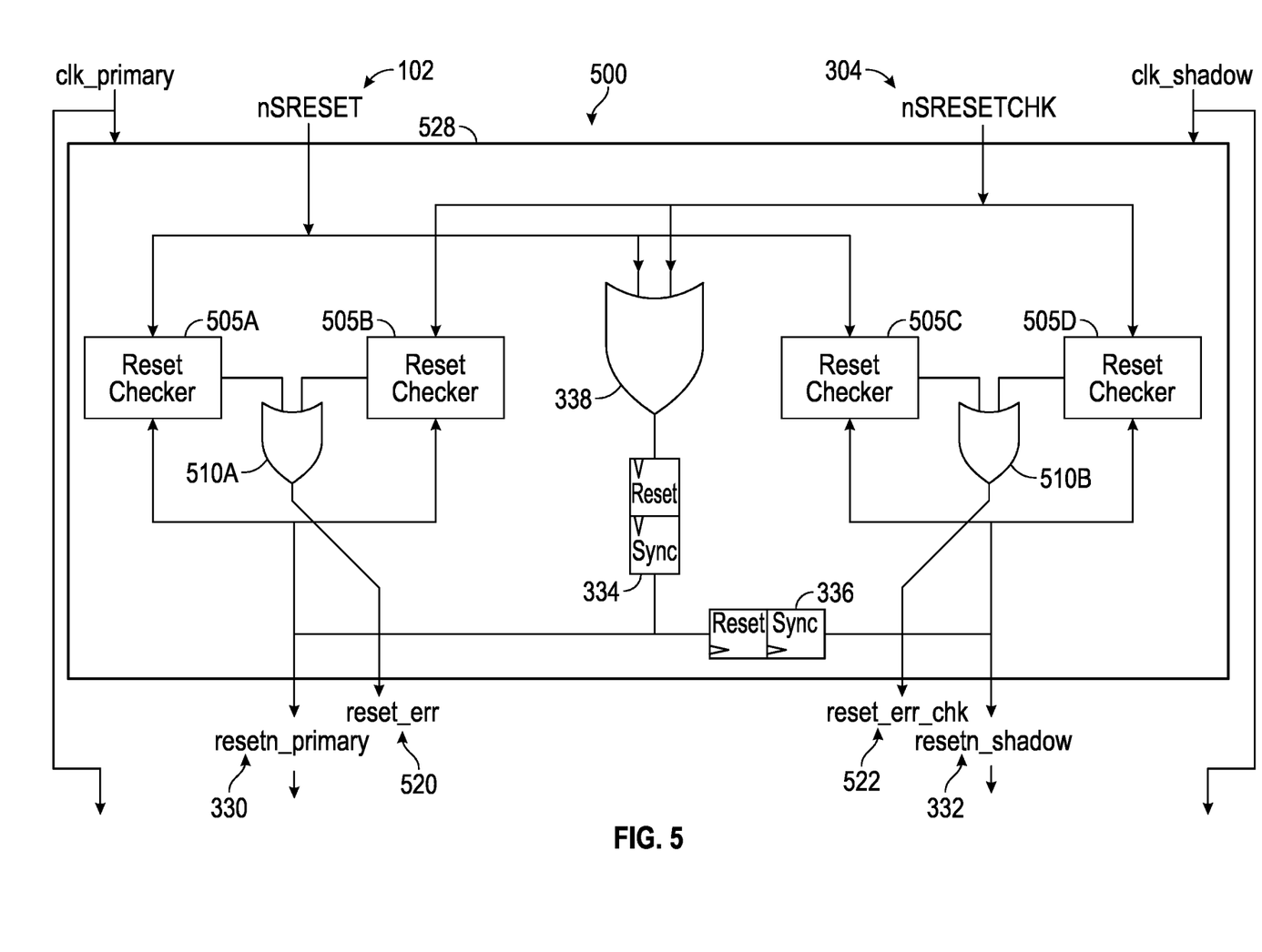
FIG. 5 illustrates a reset protection block, in accordance with an embodiment.

FIG. 5 illustrates a system 500 that detects stuck-at faults, according to an embodiment. Reset protector block 528 is comprised of flip-flop 334, flip-flop(s) 336, logical OR gate 338, reset checkers 505A, 505B, 505C, and 505D, and logical OR gates 510A and 510B. Primary reset signal 102 (nSRESET) on primary reset signal tree 110 and shadow reset signal 304 (nSRESETCHK) on shadow reset signal tree 315 are coupled to logical OR gate 338 in reset protector block 328. Primary reset signal 102 is also coupled to reset checkers 505A and 505C, and shadow reset signal 304 is also coupled to reset checkers 505B and 505D. Reset protector block 528 generates resetn_primary signal 330 and resetn_shadow signal 332 as described supra. Resetn_primary signal 330 is also coupled to reset checkers 505A and 505B, and resetn_shadow signal 332 is also coupled to reset checkers 505C and 505D. The outputs of reset checkers 505A and 505B are coupled to logical OR gate 510A, and the outputs of reset checkers 505C and 505D are coupled to logical OR gate 510B.

In operation, reset checker 505A compares primary reset signal 102 and the resetn_primary signal 330. Should it detect a difference, it produces an error signal output. Similarly, reset checker 505B compares shadow reset signal 304 and the resetn_primary signal 330. Should it detect a difference, it produces an error signal output. The error signal outputs of reset checkers 505A and 505B are coupled to the inputs of logical OR gate 510A, which generates reset_err signal 520, indicative of a stuck-at fault.

Reset checker 505C compares primary reset signal 102 and the resetn_shadow signal 332. Should it detect a difference, it produces an error signal output. Similarly, reset checker 505D compares shadow reset signal 304 and the resetn_shadow signal 332. Should it detect a difference, it produces an error signal output. The error signal outputs of reset checkers 505C and 505D are coupled to the inputs of logical OR gate 510B, which generates reset_err_chk signal 522, indicative of a stuck-at fault.

Optionally, reset_err signal 520 and reset_err_chk signal 522 may be coupled to a third logical OR gate (not shown), producing a global reset error signal output.

Figure 6:
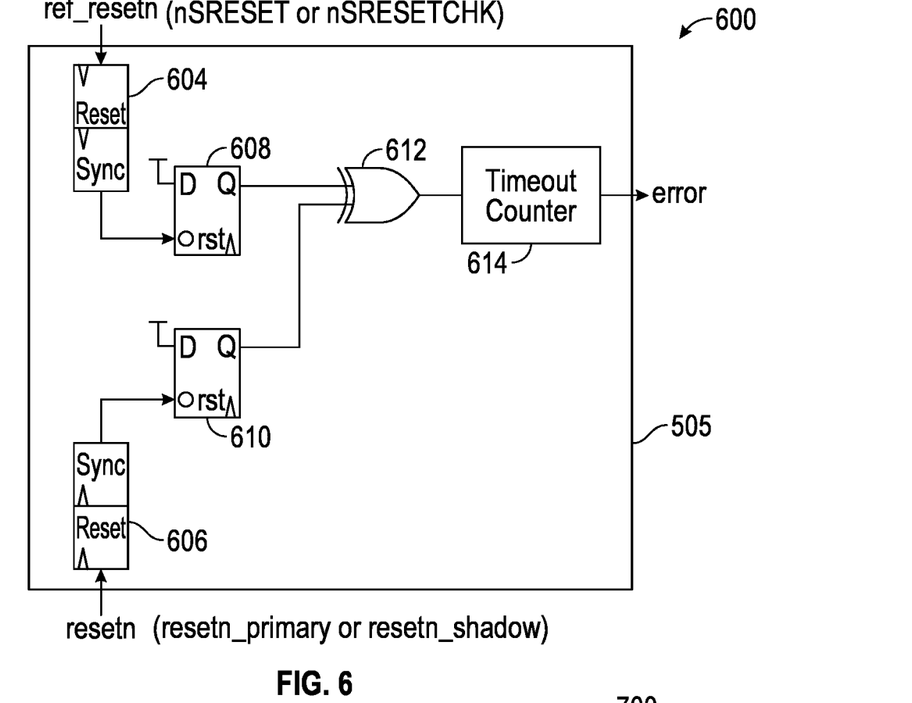
FIG. 6 illustrates a reset checker block, in accordance with an embodiment.

FIG. 6 illustrates reset checker 505, according to an embodiment. Reset checker 505 is comprised of flip-flops 604 and 606, D-flip-flops 608 and 610, logical exclusive-OR gate 612, and timeout counter 614. The reference reset signal, ref_resetn (either primary reset signal 102 (nSRESET) or shadow reset signal 304 (nSRESETCHK)) is coupled to flip-flop 604, and the test reset signal, resetn (either resetn_primary signal 330 or resetn_shadow signal 332) is coupled to flip-flop 606. Flip-flops 604 and 606 synchronize their inputs to the clock. The outputs of flip-flop 604 and flip-flop 606 are coupled to the reset inputs of D-flip-flop 608 and D-flip-flop 610, respectively, and the Q outputs of D-flip-flop 608 and D-flip-flop 610 are coupled to the inputs of logical exclusive-OR gate 612. The output of logical exclusive-OR gate 612 is coupled to timeout counter 614, which is calibrated to account for the maximum skew between the reference reset signal and test reset signal inputs. In this way, any transient, incorrect error detection made by logical exclusive-OR gate 612 in response to skew of the input signals will not be promulgated.

Figure 7:
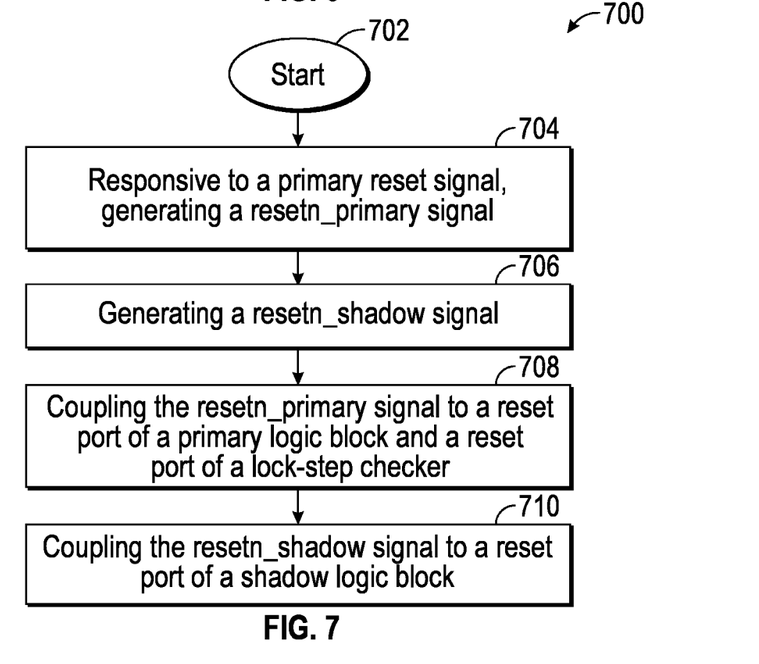
FIG. 7 illustrates a flowchart, in accordance with an embodiment.

FIG. 7 shows a flowchart 700 according to an embodiment. The algorithm 700 begins (702).

Responsive to a primary reset signal, a resetn_primary signal is generated (704). The primary reset signal was described herein in relation to FIG. 2 as the primary reset signal 102 (nSRESET) present on primary reset signal tree 110. The resetn_primary signal was described herein in relation to FIG. 2 as resetn_primary signal 230.

A resetn_shadow signal is generated (706). The resetn_shadow signal was described herein in relation to FIG. 2 as resetn_shadow signal 232.

The resetn_primary signal is coupled to a reset port of a primary logic block and a reset port of a lock-step checker (708). The primary logic block was described herein in relation to FIG. 2 as primary logic block 222. The lock-step checker was described herein in relation to FIG. 2 as lock-step checker 226.

The resetn_shadow signal is coupled to a reset port of a shadow logic block (710). The shadow logic block was described herein in relation to FIG. 2 as shadow logic block 224.

Figure 8:
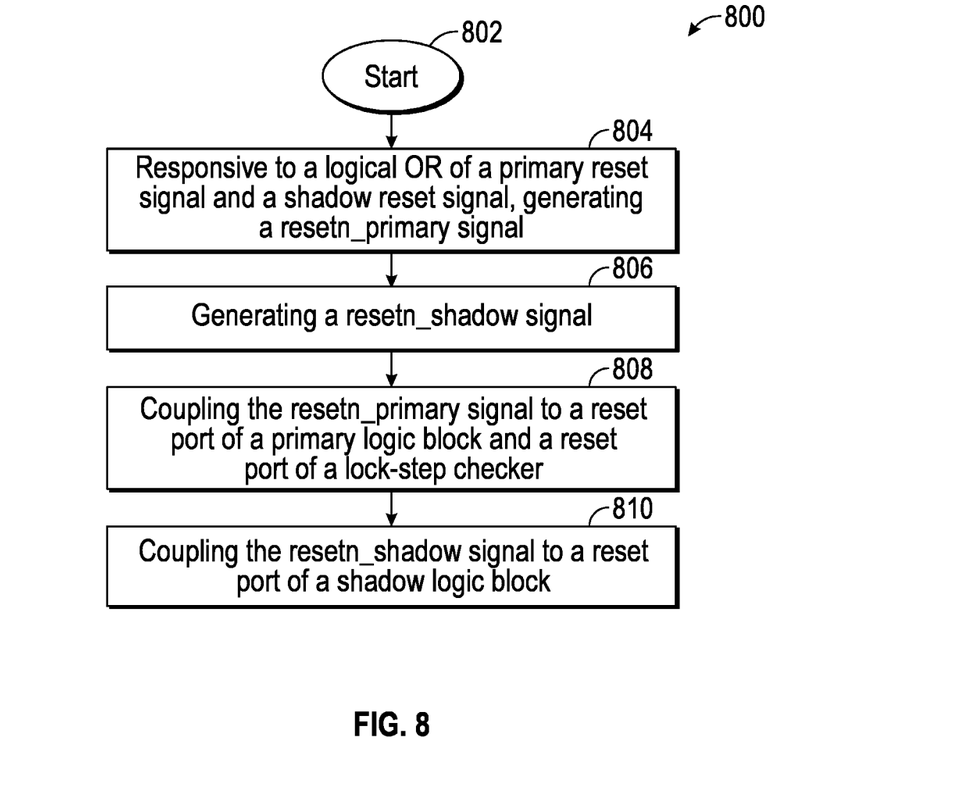
FIG. 8 illustrates a flowchart, in accordance with an embodiment.

FIG. 8 shows a flowchart 800 according to an embodiment. The algorithm 800 begins (802).

Responsive to a logical OR of a primary reset signal and a shadow reset signal, a resetn_primary signal is generated (804). The primary reset signal was described herein in relation to FIG. 3 as primary reset signal 102 (nSRESET) present on primary reset signal tree 110. The shadow reset signal was described herein in relation to FIG. 3 as shadow reset signal 304 (nSRESETCHK) present on shadow reset signal tree 315. The resetn_primary signal was described herein in relation to FIG. 3 as resetn_primary signal 330.

A resetn_shadow signal is generated (806). The resetn_shadow signal was described herein in relation to FIG. 3 as resetn_shadow signal 332.

The resetn_primary signal is coupled to a reset port of a primary logic block and a reset port of a lock-step checker (808). The primary logic block was described herein in relation to FIG. 3 as primary logic block 322. The lock-step checker was described herein in relation to FIG. 3 as lock-step checker 326.

The resetn_shadow signal is coupled to a reset port of a shadow logic block (810). The shadow logic block was described herein in relation to FIG. 3 as shadow logic block 324.

Figure 9:
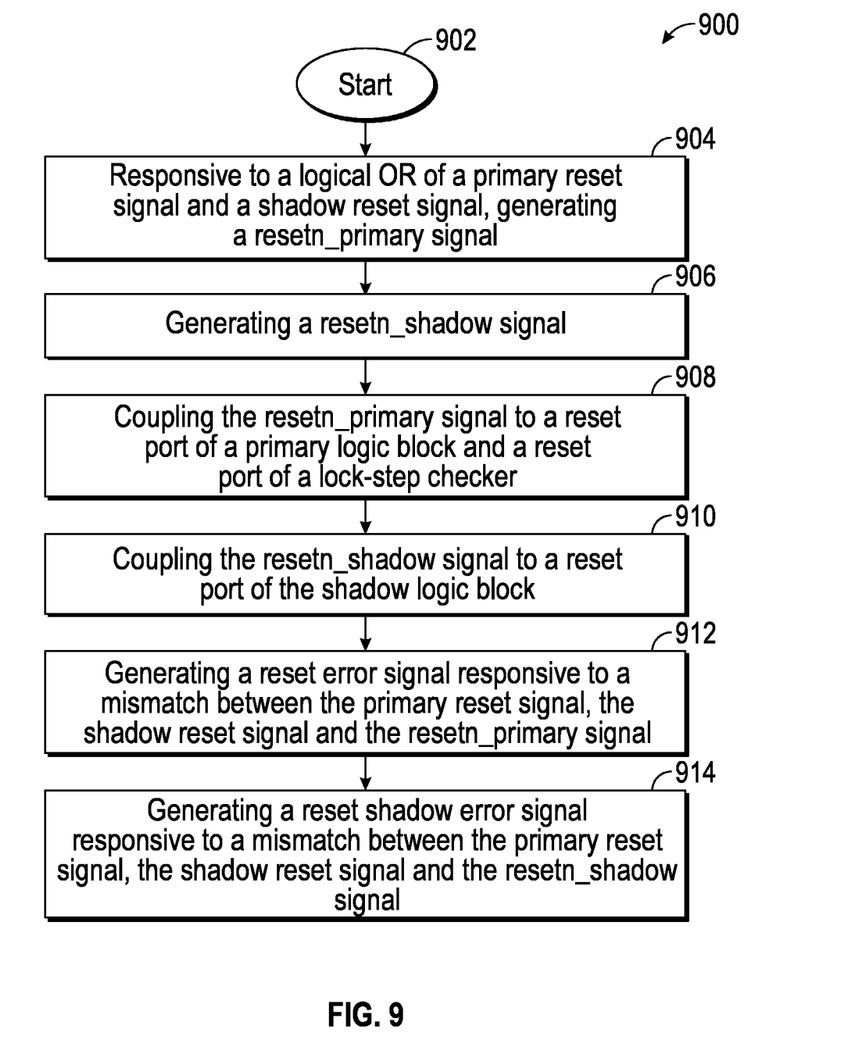
FIG. 9 illustrates a flowchart, in accordance with an embodiment.

FIG. 9 shows a flowchart 900 according to an embodiment. The algorithm 900 begins (902).

Responsive to a logical OR of a primary reset signal and a shadow reset signal, a resetn_primary signal is generated (904). The primary reset signal was described herein in relation to FIG. 5 as primary reset signal 102 (nSRESET) present on primary reset signal tree 110. The shadow reset signal was described herein in relation to FIG. 5 as shadow reset signal 304 (nSRESETCHK) present on shadow reset signal tree 315. The resetn_primary signal was described herein in relation to FIG. 5 as resetn_primary signal 330.

A resetn_shadow signal is generated (906). The resetn_shadow signal was described herein in relation to FIG. 5 as resetn_shadow signal 332.

The resetn_primary signal is coupled to a reset port of a primary logic block and a reset port of a lock-step checker (908). The primary logic block was described herein in relation to FIG. 3 as primary logic block 322. The lock-step checker was described herein in relation to FIG. 3 as lock-step checker 326.

The resetn_shadow signal is coupled to a reset port of a shadow logic block (910). The shadow logic block was described herein in relation to FIG. 3 as shadow logic block 324.

A reset_error signal is generated, responsive to a mismatch between the reset signal, the shadow reset signal and the resetn_primary signal (912). The reset_error signal was described herein in relation to FIG. 5 as reset_error signal 520.

A reset_shadow_error signal is generated, responsive to a mismatch between the reset signal, the shadow reset signal and the resetn_shadow signal (914). The reset_shadow_error signal was described herein in relation to FIG. 5 as reset_error_chk signal 522.

The series of operations 700 (FIG. 7), 800 (FIG. 8) and 900 (FIG. 9) may be stored on non-volatile memory or other suitable memory or computer-usable medium and in any suitable programming language.

Any combination of one or more computer-usable or computer-readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device.

The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if desired, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer-usable program code may be transmitted using any appropriate medium, including but not limited to wireless, wire line, optical fiber cable, RF, etc.

Computer program code for carrying out operations of the present disclosure may be written in any combination of one or more programming languages, including an object-oriented programming language such as Java, Smalltalk, C++, C# or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described above with reference to flowchart illustrations and/or block diagrams of methods, apparatus, systems and computer program products according to embodiments. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer, or other programmable data processing apparatus, create means for implementing the functions/acts specified in the flowchart and/or block diagram block or blocks. These computer program instructions may also be stored in a computer-readable medium that can direct a computer or other programmable data processing apparatus, to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operations to be performed on the computer, or other programmable apparatus to produce a computer-implemented process such that the instructions which execute on the computer or other programmable apparatus, provide processes for implementing the functions/acts specified in the flowchart and/or block diagram block or blocks.

Unless stated otherwise, terms such as "first" and "second" are used to arbitrarily distinguish between the elements such terms describe. Thus, these terms are not necessarily intended to indicate temporal or other prioritization of such elements.

As will be appreciated by one skilled in the art, the disclosure may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the embodiments may take the form of a computer program product embodied in any tangible medium of expression having computer-usable program code embodied in the medium.

It can be seen that the apparatus, system and methods presented herein provide an advancement in the state of the art.

Accordingly, some of the disclosed embodiments are set out in the following paragraphs.

One embodiment is directed to an apparatus comprising a plurality of functional units, coupled to a primary reset signal and a clock signal having a clock cycle, a functional unit of the plurality of functional units comprising: a primary logic block, having at least one output; a shadow logic block, having at least one output; a lock-step checker, coupled to the at least one output of the primary logic block and the at least one output of the shadow logic block, and operable to generate an output signal responsive to a difference between the at least one output of the primary logic block and the at least one output of the shadow logic block; and a reset protector, coupled to the primary reset signal and the clock signal and, responsive to the primary reset signal, operable to generate: a primary local reset signal having a deassertion synchronized to the clock signal, and a shadow local reset signal having a deassertion delayed n clock cycles of the clock signal with respect to the primary local reset signal, n a rational number, the primary local reset signal coupled to a reset port of the primary logic block and a reset port of the lock-step checker, and the shadow local reset signal coupled to a reset port of the shadow logic block.

Another embodiment is an apparatus, further comprising a primary reset signal tree that distributes the primary reset signal among one or more of the plurality of functional units.

A further embodiment is an apparatus where the deassertion delayed n clock cycles is 2.

Another embodiment includes a non-transitory computer readable medium containing instructions of a hardware description language descriptive of the apparatus.

Another embodiment includes a non-transitory computer readable medium containing a netlist description of the apparatus.

A further embodiment is the apparatus, where the primary reset signal is asserted with a value of logical 0.

Another embodiment includes the apparatus, where the functional unit is coupled to a shadow reset signal, and the reset protector, coupled to the shadow reset signal and, responsive to a logical OR of the primary reset signal and the shadow reset signal, is operable to generate the primary local reset signal and the shadow local reset signal.

A further embodiment includes the apparatus described above, further comprising a shadow reset signal tree that distributes the shadow reset signal among the plurality of functional units.

Another embodiment includes the apparatus described above where, responsive to a logical OR of the primary reset signal and the shadow reset signal, the reset protector is operable to generate: a reset error signal responsive to a mismatch between the primary reset signal, the shadow reset signal and the primary local reset signal, and a reset_shadow_error signal responsive to a mismatch between the primary reset signal, the shadow reset signal and the shadow local reset signal.

Another embodiment is directed to a method comprising: responsive to a primary reset signal, generating a primary local reset signal having a deassertion synchronized to a clock signal having a clock cycle; generating a shadow local reset signal having a deassertion delayed n clock cycles of the clock signal with respect to the primary local reset signal, n a rational number; coupling the primary local reset signal to a reset port of a primary logic block and a reset port of a lock-step checker; coupling the shadow local reset signal to a reset port of a shadow logic block; and generating an output signal responsive to a difference between at least one output of the primary logic block and at least one output of the shadow logic block.

A further embodiment is a method where the deassertion delayed n clock cycles is 2.

A further embodiment is a method, where the primary reset signal is asserted with a value of logical 0.

Another embodiment is a method, where the generating a primary local reset signal is responsive to a logical OR of a primary reset signal and a shadow reset signal.

Another embodiment is a method described above, further comprising: generating a reset error signal responsive to a mismatch between the primary reset signal, the shadow reset signal and the primary local reset signal; and generating a reset_shadow_error signal responsive to a mismatch between the primary reset signal, the shadow reset signal and the shadow local reset signal.

Another embodiment is a method described above, further comprising: generating a signal responsive to a mismatch between the primary reset signal, the shadow reset signal, the primary local reset signal and the shadow local reset signal.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

The invention claimed is:
1. An apparatus comprising:
a plurality of functional units, coupled to a primary reset signal and a clock signal having a clock cycle, a functional unit of the plurality of functional units comprising:
a primary logic block, having at least one output;
a shadow logic block, having at least one output;
a lock-step checker, coupled to the at least one output of the primary logic block and the at least one output of the shadow logic block, and operable to generate an output signal responsive to a difference between the at least one output of the primary logic block and the at least one output of the shadow logic block; and
a reset protector, coupled to the primary reset signal and the clock signal and, responsive to the primary reset signal, operable to generate:
a primary local reset signal having a deassertion synchronized to the clock signal, and a shadow local reset signal having a deassertion delayed n clock cycles of the clock signal with respect to the primary local reset signal, n a rational number,
the primary local reset signal coupled to a reset port of the primary logic block and a reset port of the lock-step checker, and the shadow local reset signal coupled to a reset port of the shadow logic block.

2. The apparatus of claim 1, further comprising a primary reset signal tree that distributes the primary reset signal among one or more of the plurality of functional units.

3. The apparatus of claim 1, where n is 2.

4. A non-transitory computer readable medium containing instructions of a hardware description language descriptive of the apparatus of claim 1.

5. A non-transitory computer readable medium containing a netlist description of the apparatus of claim 1.

6. The apparatus of claim 1, where the primary reset signal is asserted with a value of logical 0.

7. The apparatus of claim 1, where the functional unit is coupled to a shadow reset signal, and
the reset protector, coupled to the shadow reset signal and, responsive to a logical OR of the primary reset signal and the shadow reset signal, is operable to generate the primary local reset signal and the shadow local reset signal.

8. The apparatus of claim 7, further comprising a shadow reset signal tree that distributes the shadow reset signal among the plurality of functional units.

9. The apparatus of claim 7 where, responsive to a logical OR of the primary reset signal and the shadow reset signal, the reset protector is operable to generate:
a reset error signal responsive to a mismatch between the primary reset signal, the shadow reset signal and the primary local reset signal, and
a reset shadow error signal responsive to a mismatch between the primary reset signal, the shadow reset signal and the shadow local reset signal.

10. A method comprising:
responsive to a primary reset signal, generating a primary local reset signal having a deassertion synchronized to a clock signal having a clock cycle;
generating a shadow local reset signal having a deassertion delayed n clock cycles of the clock signal with respect to the primary local reset signal, n a rational number;
coupling the primary local reset signal to a reset port of a primary logic block and a reset port of a lock-step checker;
coupling the shadow local reset signal to a reset port of a shadow logic block; and
generating an output signal responsive to a difference between at least one output of the primary logic block and at least one output of the shadow logic block.

11. The method of claim 10, where n is 2.

12. The method of claim 10, where the primary reset signal is asserted with a value of logical 0.

13. The method of claim 10, where the generating a primary local reset signal is responsive to a logical OR of a primary reset signal and a shadow reset signal.

14. The method of claim 13, further comprising:
generating a reset error signal responsive to a mismatch between the primary reset signal, the shadow reset signal and the primary local reset signal; and
generating a reset shadow error signal responsive to a mismatch between the primary reset signal, the shadow reset signal and the shadow local reset signal.

15. The method of claim 13, further comprising:
generating a signal responsive to a mismatch between the primary reset signal, the shadow reset signal, the primary local reset signal and the shadow local reset signal.

\* \* \* \* \*